(12) United States Patent
Baker

(10) Patent No.: US 11,156,655 B2
(45) Date of Patent: Oct. 26, 2021

(54) EMBEDDING AND DETECTING CODES IN MONITORING SIGNATURES

(71) Applicant: Siemens Mobility Pty Ltd., Bayswater (AU)

(72) Inventor: Stephen Baker, Mornington (AU)

(73) Assignee: Siemens Mobility Pty Ltd., Bayswater (AU)

( * ) Notice: Subject to any disclaimer, the term of this patent is extended or adjusted under 35 U.S.C. 154(b) by 0 days.

(21) Appl. No.: 16/649,788

(22) PCT Filed: Sep. 25, 2017

(86) PCT No.: PCT/US2017/053156
§ 371 (c)(1),
(2) Date: Mar. 23, 2020

(87) PCT Pub. No.: WO2019/059937
PCT Pub. Date: Mar. 28, 2019

(65) Prior Publication Data
US 2020/0278396 A1    Sep. 3, 2020

(51) Int. Cl.
*G01R 31/00* (2006.01)
*G01R 31/28* (2006.01)
(Continued)

(52) U.S. Cl.
CPC ......... *G01R 31/28* (2013.01); *G01R 19/2513* (2013.01); *G01R 31/3275* (2013.01); *G01R 31/50* (2020.01); *G01R 31/52* (2020.01)

(58) Field of Classification Search
None
See application file for complete search history.

(56) References Cited

U.S. PATENT DOCUMENTS

| | | |
|---|---|---|
| 6,430,518 B1 | 8/2002 | Roche |
| 2009/0287430 A1* | 11/2009 | Atoji ............... G01R 31/50 702/58 |

(Continued)

FOREIGN PATENT DOCUMENTS

| | | |
|---|---|---|
| EP | 1378758 A1 | 1/2004 |
| EP | 2503343 A1 | 9/2012 |
| GB | 2546553 A | 7/2017 |

OTHER PUBLICATIONS

Chun Gan et al., "Wavelet Packet Decomposition-Based Fault Diagnosis Scheme for SRM Drives With a Single Current Sensor", IEEE Transactions of Energy Conversion, IEEE Service Center, Piscatawy, NJ., vol. 31, No. 1, Mar. 1, 2016, pp. 303-313.
(Continued)

*Primary Examiner* — Jas A Sanghera

(57) ABSTRACT

At least one monitoring element may be configured to sense a current drawn by equipment being monitored from at least one power source and produce a monitoring signature representing the sensed current. At least one sensor may be configured to output a detection signal in response to a change in a monitored condition. At least one circuit element may be placed in series between the at least one power source and the equipment being monitored. The at least one circuit element may be configured to couple the at least one power source and the equipment being monitored by default and decouple the at least one power source from the equipment being monitored in response to receiving the detection signal. The monitoring signature may include a feature representing the change in the monitored condition in response to the at least one circuit element decoupling the at least one power source from the equipment being monitored.

10 Claims, 4 Drawing Sheets

(51) Int. Cl.
    *G01R 19/25*     (2006.01)
    *G01R 31/327*     (2006.01)
    *G01R 31/50*     (2020.01)
    *G01R 31/52*     (2020.01)

(56) References Cited

U.S. PATENT DOCUMENTS

| | | | |
|---|---|---|---|
| 2011/0068819 A1* | 3/2011 | Sims | G01R 31/40 324/764.01 |
| 2014/0152316 A1 | 6/2014 | Stanek et al. | |
| 2017/0183021 A1* | 6/2017 | Johnson | B61L 5/06 |

OTHER PUBLICATIONS

PCT International Search Report and Written Opinion of International Searching Authority dated Jun. 6, 2018 corresponding to PCT International Application No. PCT/US2018/053156 filed Sep. 25, 2017.

\* cited by examiner

EMBEDDING AND DETECTING CODES IN MONITORING SIGNATURES

BACKGROUND

Remote monitoring systems are used to monitor various types of equipment. Remote monitoring systems include connections between the sensors used for monitoring the equipment and other elements of the remote monitoring system (e.g., a processor, a display, etc.). For example, rail infrastructure monitoring systems often monitor current through a portion of an electrical circuit. A monitoring system can detect a signal containing a current signature. The monitoring system can detect irregularities in the current signature and/or present the current signature to a user so the user can look for irregularities.

SUMMARY

Remote monitoring systems and methods described herein may embed additional information into current signatures used to monitor electrical components. For example, a current loop circuit between a power source, a monitored component, and the monitoring system may include one or more additional components. The additional components may include one or more sensors monitoring separate conditions from the current monitored by the monitoring system. The additional components may cause a change in the current signature in response to a change in one or more of the conditions. The change in the current signature may be detected so that the current signature can be used to monitor both the current draw of the equipment and the one or more additional conditions.

DETAILED DESCRIPTION OF SEVERAL EMBODIMENTS

Figure 1:
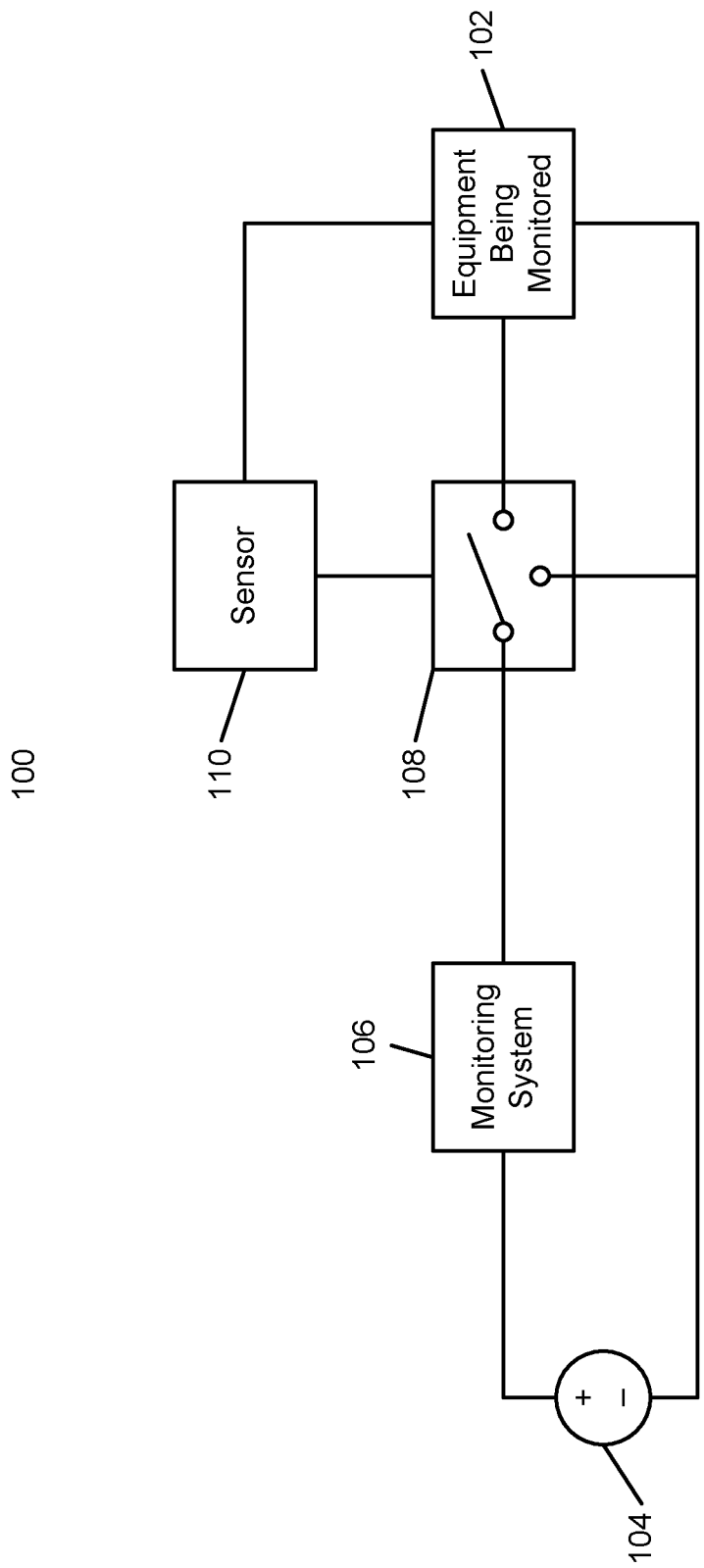
FIG. 1 is a diagram of a monitoring circuit according to an embodiment of the invention.

FIG. 1 is a diagram of a monitoring circuit 100 according to an embodiment of the invention. Circuit 100 may include equipment 102 and a power source 104. Monitoring system 106 may be disposed between power source 104 and equipment 102. Monitoring system 106 may be configured to detect a monitoring signature. For example, the monitoring signature may be current signature showing a current drawn by equipment 102 over time. Some examples of equipment 102 that may be monitored with a current signature may include point machines and/or trainstops.

Figure 2:
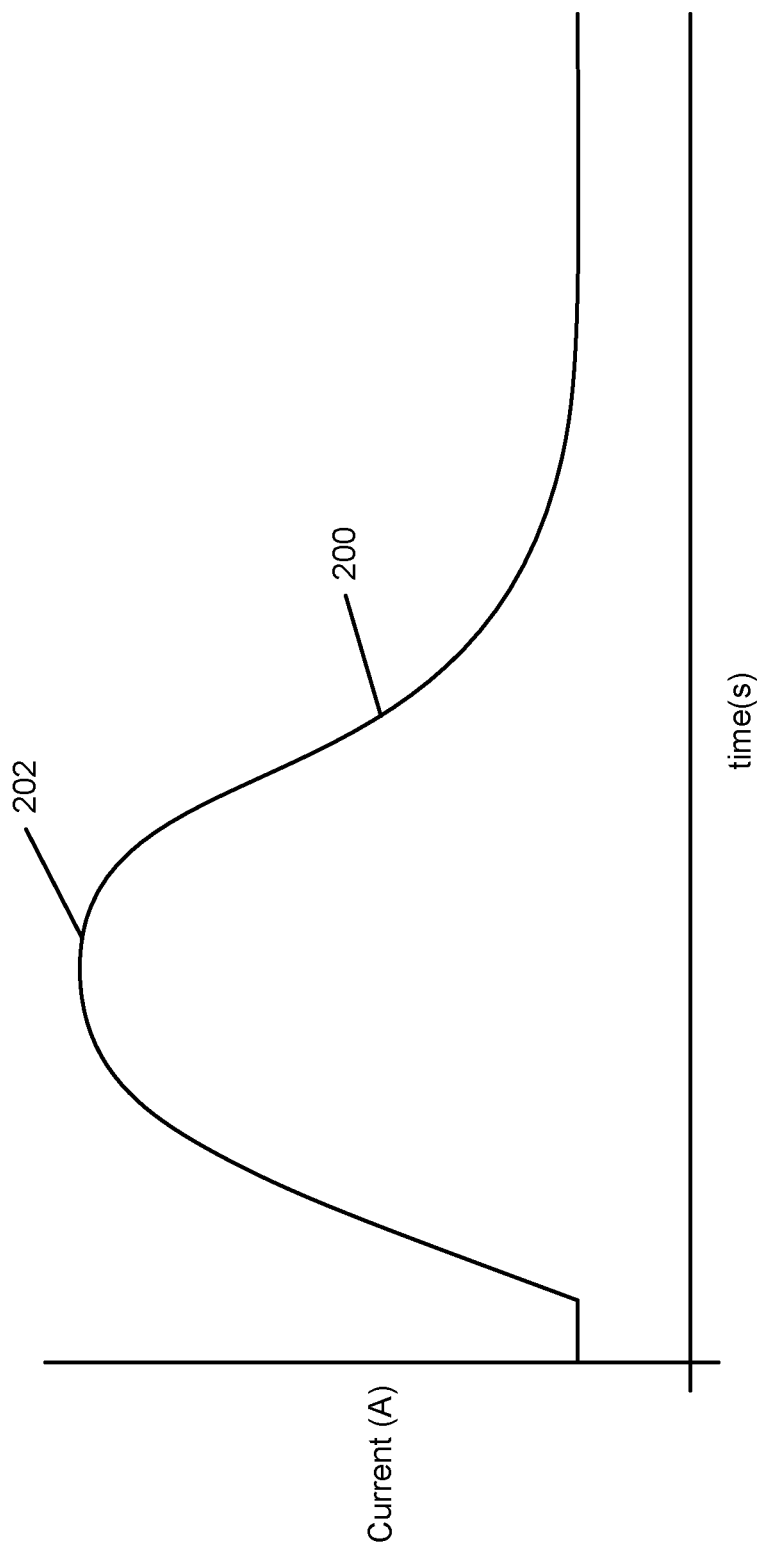
FIG. 2 is an undistorted monitoring signature according to an embodiment of the invention.

FIG. 2 is an undistorted monitoring signature 200 according to an embodiment of the invention. The vertical axis in this example indicates current (measured in amperes (A)), and the horizontal axis in this example indicates time (measured in seconds (s)). Example signature 200 includes a current that rapidly rises to peak 202 (e.g., shortly after equipment 102 performs some operation drawing current from power source 104) and falls. Signature 200 is presented as an example only, and different types of equipment 102 may produce different signatures.

Returning to FIG. 1, monitoring system 106 may analyze monitoring signatures (e.g., signature 200) produced by equipment 102 drawing current from power source 104. For example, a processor of monitoring system 106 may compare a sensed monitoring signature with a known or expected signature for equipment 102. If the sensed monitoring signature matches the expected signature or is substantially similar to the expected signature within an established tolerance, the processor may determine that equipment 102 is behaving normally. Additionally or alternatively, monitoring system 106 may illustrate the sensed monitoring signature on a display (e.g., a monitor or touchscreen), allowing a user to evaluate the sensed monitoring signature for irregularities.

Monitoring circuit 100 may include additional components configured to insert additional information into the sensed monitoring signature. For example, monitoring circuit 100 may include switch 108 or another circuit element or device configured to modify a current drawn from power source 104. Switch 108 may be configured to couple monitoring system 106 (and, therefore, power source 104) to equipment 102 in one position and to couple monitoring system 106 to ground in another position. In some embodiments, switch 108 may couple monitoring system 106 to equipment 102 by default. When triggered, switch 108 may couple monitoring system 106 to ground, altering the signature sensed by monitoring system 106. Thus, when triggered to move from the default position, switch 108 may be configured to momentarily disrupt power supplied to equipment 102. Switch 108 may be configured to return to the default position quickly enough so that the power disruption does not impact operation of equipment 102 in some embodiments.

Figure 3:
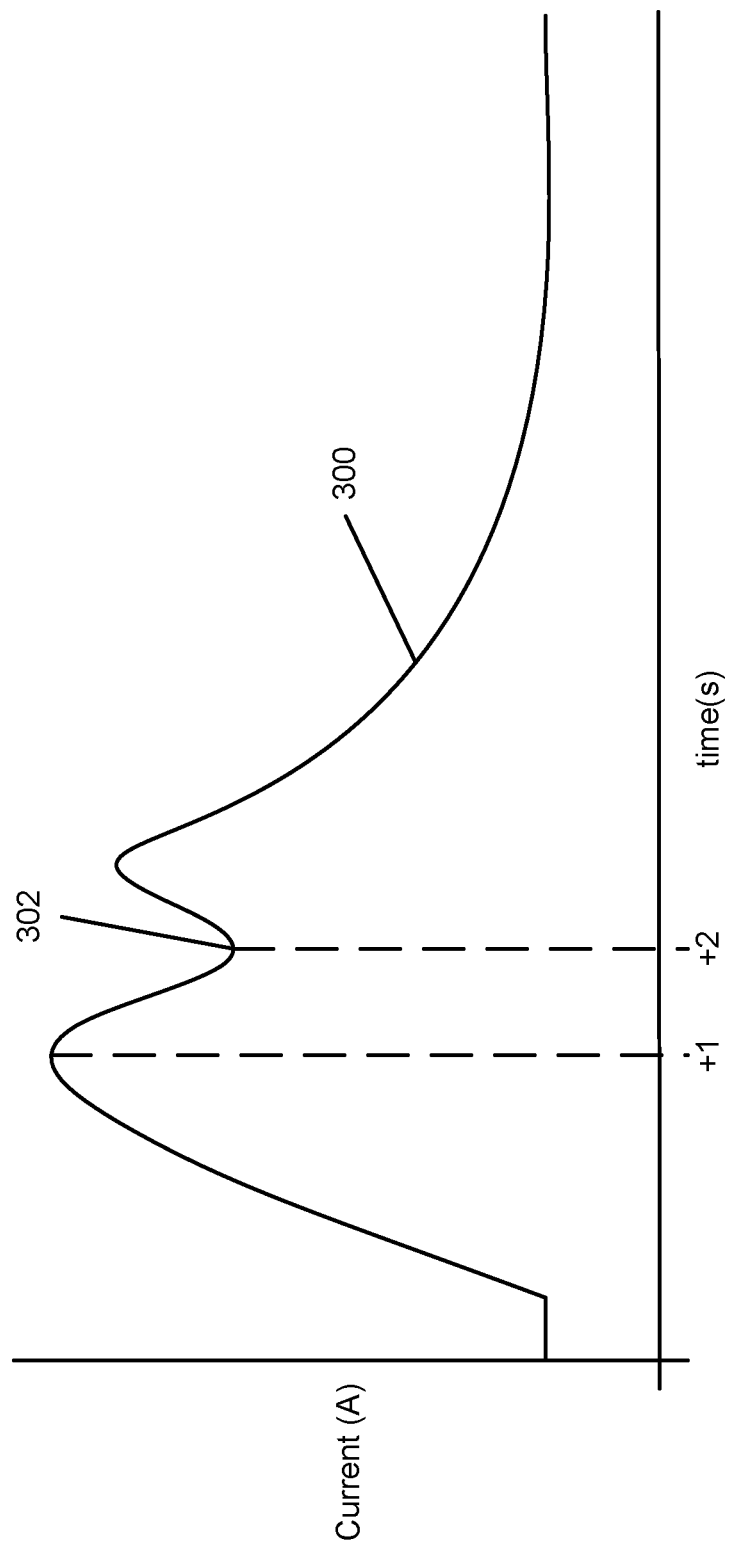
FIG. 3 is a distorted monitoring signature according to an embodiment of the invention.

FIG. 3 is a distorted monitoring signature 300 according to an embodiment of the invention. Example signature 300 is similar to example signature 200 of FIG. 2, except the peak is interrupted by dip 302, which may be produced when switch 108 is triggered at time t1 and returned to the default position at time t2. Signature 300 is presented as an example only, and signature 200 (or any other signature) may be altered differently by changing the switch position at times other than t1 and t2. Also, while dip 302 indicates switch 108 triggering for circuit 100 of FIG. 1, other embodiments may produce different effects. For example, a pole of switch 108 may be tied to a DC voltage instead of ground, and signature 300 may go to the DC voltage instead of ground when switch 108 is triggered.

Returning to FIG. 1, monitoring system 106 may analyze monitoring signatures (e.g., signature 300) produced by equipment 102 and altered by operation of switch 108. For example, a processor of monitoring system 106 may compare a sensed monitoring signature with a known or expected signature for equipment 102. If a dip (e.g., dip 302) is detected, the processor may determine that switch 108 was triggered. Additionally or alternatively, monitoring system 106 may illustrate the sensed monitoring signature on a display (e.g., a monitor or touchscreen), allowing a user to observe the dip and determine that switch 108 was triggered.

Switch 108 may be triggered by receiving a signal, such as an output produced by sensor 110. Sensor 110 may be configured to monitor equipment 102 and/or other equipment (not shown). When a sensor condition is met, or when a sensor condition fails to be met in some embodiments, sensor 110 may output a signal to switch 108. The signal may drive switch 108 to momentarily move from the default position, thereby altering the sensed monitoring signature detected by monitoring system 106. Some examples of conditions that may be monitored by sensor 110 may include oil levels in hydraulic systems (e.g., where sensor 110 reports an output when the oil level falls below a predetermined level), air pressure in pneumatic systems (e.g., where sensor 110 reports an output when the air pressure falls below a predetermined pressure), a contact in a point machine set to indicate a potential detection failure, a cover being left open, etc. Sensor 110 may be any sensor configured to monitor and report on any condition that can be represented by a binary output.

In some embodiments, a different circuit element or device may be inserted in place of switch 108. Monitoring circuit 100 may include any circuit element or device configured to modify the monitoring signature in response to an output from sensor 110 instead of a switch. For example, some embodiments may include, in place of switch 108, a circuit configured to cause monitoring circuit 100 to draw more current from power source 104 in response to receiving the output from sensor 110. In this example, a monitoring signature observed by monitoring system 106 may include a peak instead of a dip (e.g., dip 302 as shown in signature 300) to indicate that sensor 110 reported an output.

Figure 4:
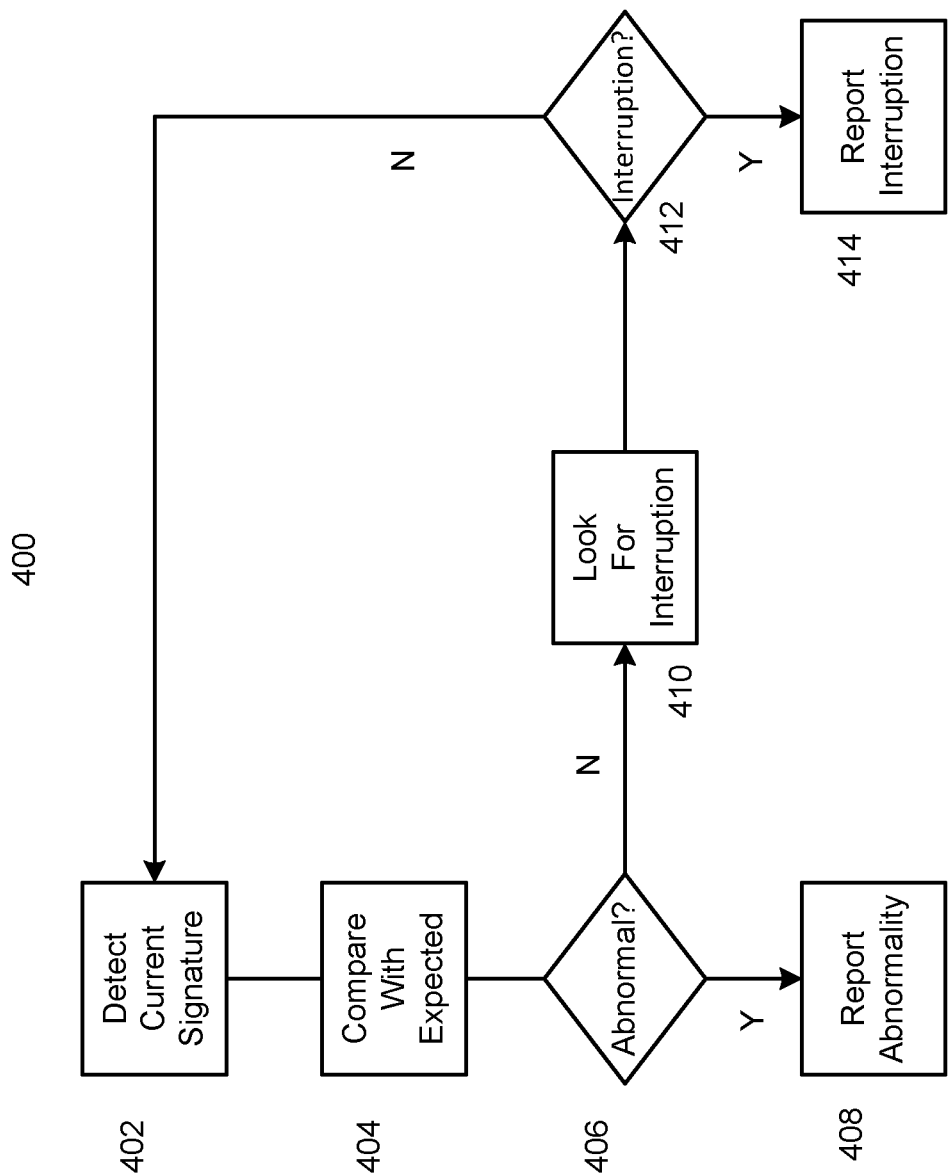
FIG. 4 is a monitoring process according to an embodiment of the invention.

FIG. 4 is a monitoring process 400 according to an embodiment of the invention. Process 400 may be performed by a processor of monitoring system 106, for example, to automatically detect abnormal monitoring signatures and/or conditions represented by monitoring signatures altered by switch 108.

In 402, the processor of monitoring system 106 may detect or receive a monitoring signature. For example, the monitoring signature may represent current drawn by equipment 102 as it is powered by power source 104, as described above.

In 404, the processor of monitoring system 106 may compare the monitoring signature with an expected monitoring signature. In 406, the processor of monitoring system 106 may determine whether the comparison indicates that the monitoring signature is abnormal (e.g., if the monitoring signature diverges from the expected signature by more than an acceptable range. In 408, if abnormality is detected, the processor of monitoring system 106 may report the detection (e.g., by indicating a problem on a display or by sending a message to a user computing device).

In 410, the processor of monitoring system 106 may evaluate the monitoring signature for interruptions produced when switch 108 is triggered, as described above. The processor may be configured to identify a feature in the monitoring signature (e.g., dip 302 of signature 300) that is produced by triggering of switch 108. In 414, if the feature is detected, the processor of monitoring system 106 may report the detection (e.g., by indicating presence or absence of the condition monitored by sensor 110, as appropriate, on a display or by sending a message to a user computing device).

Process 400 may continuously monitor equipment 102. For example, after a monitoring signature is received and evaluated, the processor of monitoring system 106 may wait to receive or detect another signature at 402, causing process 400 to repeat the steps described above.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, while circuit 100 includes a single sensor 110 and switch 108, those of ordinary skill will appreciate that multiple pairs of sensors and switches may be provided, each configured to insert a different feature (e.g., a decoupling of a different length of time) to indicate a different detected condition.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A circuit comprising:
    a monitoring element configured to detect a monitoring signature, wherein the monitoring signature is a current signature showing a current drawn from at least one power source over time by an equipment being monitored;
    a switch configured to couple the monitoring system to the equipment in one position and to couple the monitoring system to ground in another position, thus altering the monitoring signature detected by the monitoring system; and
    a sensor configured to monitor the equipment and to output a signal for switching the switch when a sensor condition is met,
    wherein the monitoring system may analyze the monitoring signatures produced by the equipment and altered by the operation of the switch and detect that the switch has been triggered.

2. The circuit of claim 1, wherein the equipment being monitored comprises a point machine or a trainstop.

3. The circuit of claim 1, wherein the sensor comprises a fluid level sensor, a pressure sensor, a contact sensor, or an open/closed sensor, or a combination thereof.

4. The circuit of claim 1, wherein the monitoring system comprises a processor configured to detect an abnormal current from the monitoring signature and alert a user in response to detecting the abnormal current.

5. The circuit of claim 1, wherein the monitoring system comprises a display configured to present the detected monitoring signature allowing a user to determine that the switch was triggered.

6. A monitoring method comprising:
    detecting, by a monitoring system, a monitoring signature, wherein the monitoring signature is a current signature showing a current drawn from at least one power source over time by an equipment being monitored;
    coupling, by a switch, the monitoring system to the equipment in one position and coupling the monitoring system to ground in another position, thus altering the monitoring signature detected by the monitoring system;

monitoring, by a sensor, the equipment and outputting, by the sensor, a signal for switching the switch when a sensor condition is met; and analyzing, by the monitoring system, the monitoring signatures produced by the equipment and altered by the operation of the switch and detecting, by the monitoring system, that the switch has been triggered.

7. The method of claim 6, wherein the equipment being monitored comprises a point machine or a trainstop.

8. The method of claim 6, wherein the sensing comprises sensing a fluid level, a pressure, a contact, or an open/closed state, or a combination thereof.

9. The method of claim 6, further comprising:
detecting, with a processor of the monitoring system, an abnormal current from the monitoring signature; and
alerting, with the processor, a user in response to detecting the abnormal current.

10. The method of claim 6, further comprising presenting, with a display of the monitoring system, the monitoring signature allowing a user to determine that the switch was triggered.

\* \* \* \* \*